United States Patent
Ohashi

(10) Patent No.: US 12,324,103 B2
(45) Date of Patent: Jun. 3, 2025

(54) IMAGE PROCESSING DEVICE

(71) Applicant: FUJI CORPORATION, Chiryu (JP)

(72) Inventor: Teruyuki Ohashi, Anjo (JP)

(73) Assignee: FUJI CORPORATION, Chiryu (JP)

( * ) Notice: Subject to any disclaimer, the term of this patent is extended or adjusted under 35 U.S.C. 154(b) by 552 days.

(21) Appl. No.: 17/762,242

(22) PCT Filed: Sep. 26, 2019

(86) PCT No.: PCT/JP2019/037949
§ 371 (c)(1),
(2) Date: Mar. 21, 2022

(87) PCT Pub. No.: WO2021/059445
PCT Pub. Date: Apr. 1, 2021

(65) Prior Publication Data
US 2022/0346296 A1     Oct. 27, 2022

(51) Int. Cl.
*H05K 13/08*      (2006.01)
*G05B 19/409*    (2006.01)
(Continued)

(52) U.S. Cl.
CPC ....... *H05K 13/0812* (2018.08); *G05B 19/409* (2013.01); *H05K 13/0015* (2013.01);
(Continued)

(58) Field of Classification Search
CPC ........... G05B 2219/31308; G05B 2219/45029; G05B 19/409; H05K 13/0812;
(Continued)

(56) References Cited

U.S. PATENT DOCUMENTS 6,434,264 B1 *  8/2002  Asar ................... H05K 13/0815
                                                     414/749.6
6,542,238 B1 *  4/2003  Tsuboi ............... H05K 13/0812
                                                     356/401
(Continued)

FOREIGN PATENT DOCUMENTS

CN          106843661 A      6/2017
DE   10 2015 115 065 A1     3/2017
(Continued)

OTHER PUBLICATIONS

Jin et al., "Reference-Free Path-Walking Method for Ball Grid Array Inspection in Surface Mounting Machines," in IEEE Transactions on Industrial Electronics, vol. 64, No. 8, pp. 6310-6318, Aug. 2017. (Year: 2017).*

(Continued)

*Primary Examiner* — A. Dexter Tugbang
(74) *Attorney, Agent, or Firm* — Oblon, McClelland, Maier & Neustadt, L.L.P.

(57) ABSTRACT

The image processing device displays, on a display, a virtual screen obtained by viewing, from above, an aggregate board in which multiple unit boards having a common component configuration are arranged. A control section of the image processing device uses one unit board at a predetermined position among the multiple unit boards as a reference unit board, generates a detailed image in which respective components are arranged on the unit board based on positional information of all components to be mounted on the unit boards, for the reference unit board, generates a simplified image obtained by simplifying the unit board, for a non-reference unit board other than the reference unit board among the multiple unit boards, and displays a simple virtual screen displaying the detailed image at a position of the (Continued)

reference unit board and the simplified image at a position of the non-reference unit board as the virtual screen.

7 Claims, 7 Drawing Sheets

(51) Int. Cl.
    *H05K 13/00*     (2006.01)
    *G06T 7/73*     (2017.01)
    *G09F 9/302*     (2006.01)

(52) U.S. Cl.
    CPC .................. *H05K 13/0815* (2018.08); *G05B 2219/31308* (2013.01); *G05B 2219/45029* (2013.01); *G06T 7/73* (2017.01); *G06T 2207/30164* (2013.01); *G09F 9/3026* (2013.01); *H05K 13/0882* (2018.08)

(58) Field of Classification Search
    CPC ........... H05K 13/0015; H05K 13/0815; H05K 13/0882; G09F 9/3026; G06T 7/73; G06T 2207/30164
    See application file for complete search history.

(56) References Cited

U.S. PATENT DOCUMENTS

| | | |
|---|---|---|
| 2017/0202117 A1 | 7/2017 | Kito |
| 2018/0089860 A1* | 3/2018 | Ikuta .......................... G06T 7/73 |
| 2019/0029153 A1 | 1/2019 | Amano et al. |

FOREIGN PATENT DOCUMENTS

| | | | |
|---|---|---|---|
| JP | 3397929 B2 | | 4/2003 |
| JP | 2012220444 A | * | 11/2012 |
| WO | WO 2016/016933 A1 | | 4/2016 |
| WO | WO 2017/126025 A1 | | 7/2017 |

OTHER PUBLICATIONS

International Search Report mailed on Jan. 7, 2020 in PCT/JP2019/037949 filed on Sep. 26, 2019 (2 pages).

* cited by examiner

Fig. 3

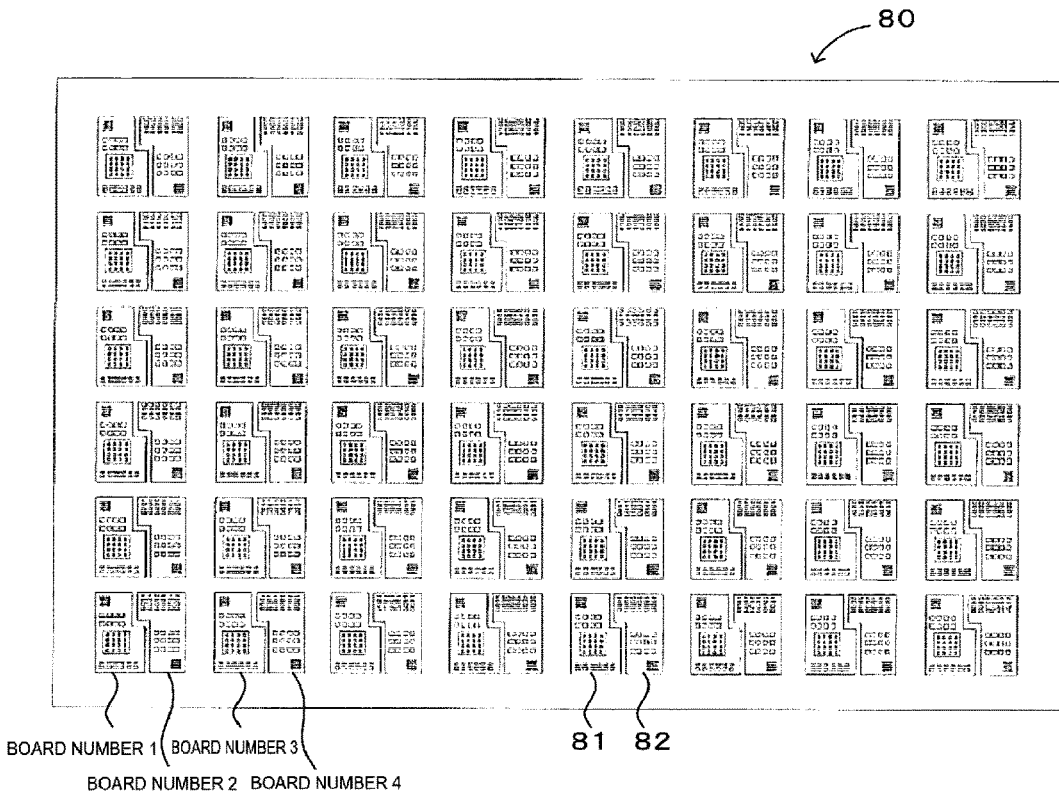

BOARD NUMBER 1  BOARD NUMBER 3
BOARD NUMBER 2  BOARD NUMBER 4

Fig. 4

| POSITIONAL INFORMATION OF COMPONENT OF FIRST UNIT BOARD | | | |
|---|---|---|---|
| COMPONENT NUMBER | X | Y | $\theta$ |
| 1 | Xa1 | Ya1 | $\theta$ a1 |
| 2 | Xa2 | Ya2 | $\theta$ a2 |
| . | . | . | . |
| . | . | . | . |
| . | . | . | . |
| m | Xam | Yam | $\theta$ am |
| POSITIONAL INFORMATION OF FIRST UNIT BOARD | | | |
| BOARD NUMBER | X | Y | |
| 1 | Xb1 | Yb1 | |
| 3 | Xb2 | Yb2 | |
| 5 | Xb3 | Yb3 | |
| . | . | . | |
| . | . | . | |
| . | . | . | |
| (2p−1) | Xbp | Ybp | |

| POSITIONAL INFORMATION OF COMPONENT OF SECOND UNIT BOARD | | | |
|---|---|---|---|
| COMPONENT NUMBER | X | Y | $\theta$ |
| 1 | Xc1 | Yc1 | $\theta$ c1 |
| 2 | Xc2 | Yc2 | $\theta$ c2 |
| . | . | . | . |
| . | . | . | . |
| . | . | . | . |
| n | Xcn | Ycn | $\theta$ cn |
| POSITIONAL INFORMATION OF SECOND UNIT BOARD | | | |
| BOARD NUMBER | X | Y | |
| 2 | Xd1 | Yd1 | |
| 4 | Xd2 | Yd2 | |
| 6 | Xd3 | Yd3 | |
| . | . | . | |
| . | . | . | |
| . | . | . | |
| 2p | Xdp | Ydp | |

IMAGE PROCESSING DEVICE

TECHNICAL FIELD

The present specification discloses an image processing device.

BACKGROUND ART

Conventionally, a component mounter has been known which mounts a predetermined number of components on a board by repeating an operation of picking up a component supplied from a component supply device by using a nozzle, transferring the component onto the board, and mounting the component at a predetermined position on the board. Further, since efficiency is low in a case where a small board such as an LED board is conveyed one by one to a component mounter, it is also known to use an aggregate board (so-called multi-surface board) in which many small boards are arranged as a unit board (for example, Patent Document 1). The aggregate board is attached such that multiple unit boards can be detached. The component mounter can perform component mounting on many unit boards at a time by mounting multiple components per unit board for the conveyed aggregate board. In displaying such an aggregate board on a display, a virtual screen obtained by viewing the aggregate board from above may be displayed on the display. Specifically, for respective unit boards included in the aggregate board, a detailed image including all components to be mounted on the unit boards is displayed.

PATENT LITERATURE

Patent Document 1: Japanese Patent No. 3397929

BRIEF SUMMARY

Technical Problem

However, when positions or types of components of a unit board are changed, detailed images of all unit boards included in the aggregate board needs to be regenerated, and thus, there is a problem that it takes time before a changed virtual screen of the aggregate board is displayed on a display.

An image processing device disclosed in the present specification is provided to solve the above-described problems, and a principal object thereof is to reduce time required to display a virtual screen of an aggregate board.

Solution to Problem

An image processing device disclosed in the present specification is an image processing device for displaying, on a display, a virtual screen obtained by viewing, from above, an aggregate board in which multiple unit boards having a common component configuration are arranged, and include a storage section storing positional information of all components to be mounted on the unit boards, and a control section that uses one unit board at a predetermined position among the multiple unit boards as a reference unit board, generates a detailed image in which respective components are arranged on the unit board based on the positional information of all components to be mounted on the unit boards, for the reference unit board, generates a simplified image obtained by simplifying the unit board, for a non-reference unit board other than the reference unit board among the multiple unit boards, and displays a simple virtual screen displaying the detailed image at a position of the reference unit board and the simplified image at a position of the non-reference unit board as the virtual screen.

When displaying, on a display, a virtual screen obtained by viewing, from above, an aggregate board in which multiple common unit boards are arranged, an image processing device displays a simple virtual screen in which a detailed image is displayed at a position of a reference unit board and a simplified image is displayed at a position of a non-reference unit board. Accordingly, time required for display is reduced compared to displaying, on a display, a detailed virtual screen in which detailed images are displayed for all unit boards.

BRIEF DESCRIPTION OF DRAWINGS

FIG. 3 is a plan view of board 80.

FIG. 4 is an explanatory diagram of information stored in storage section 63.

DESCRIPTION OF EMBODIMENTS

Figure 1:
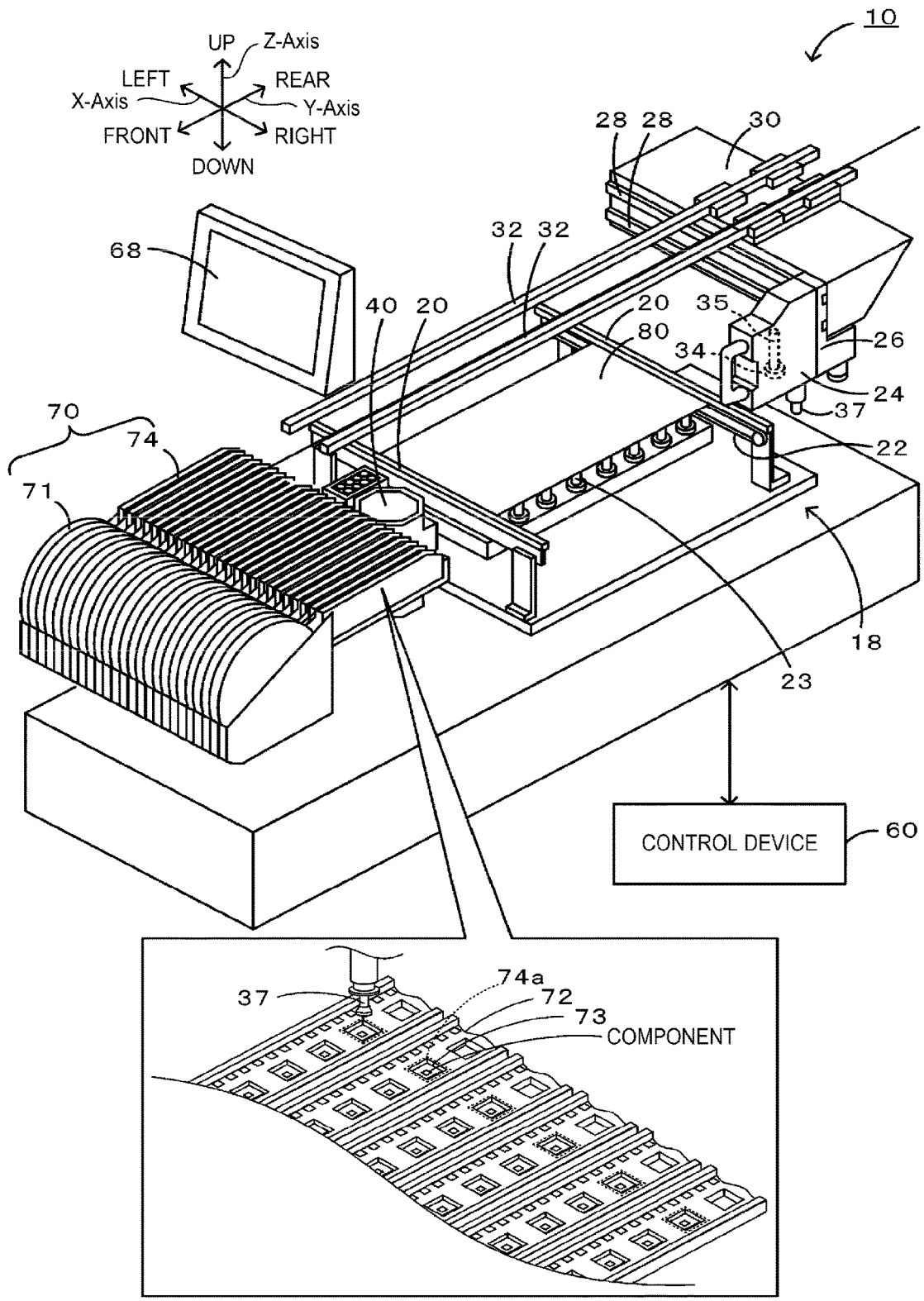
FIG. 1 is a perspective view of component mounter 10.
Figure 2:
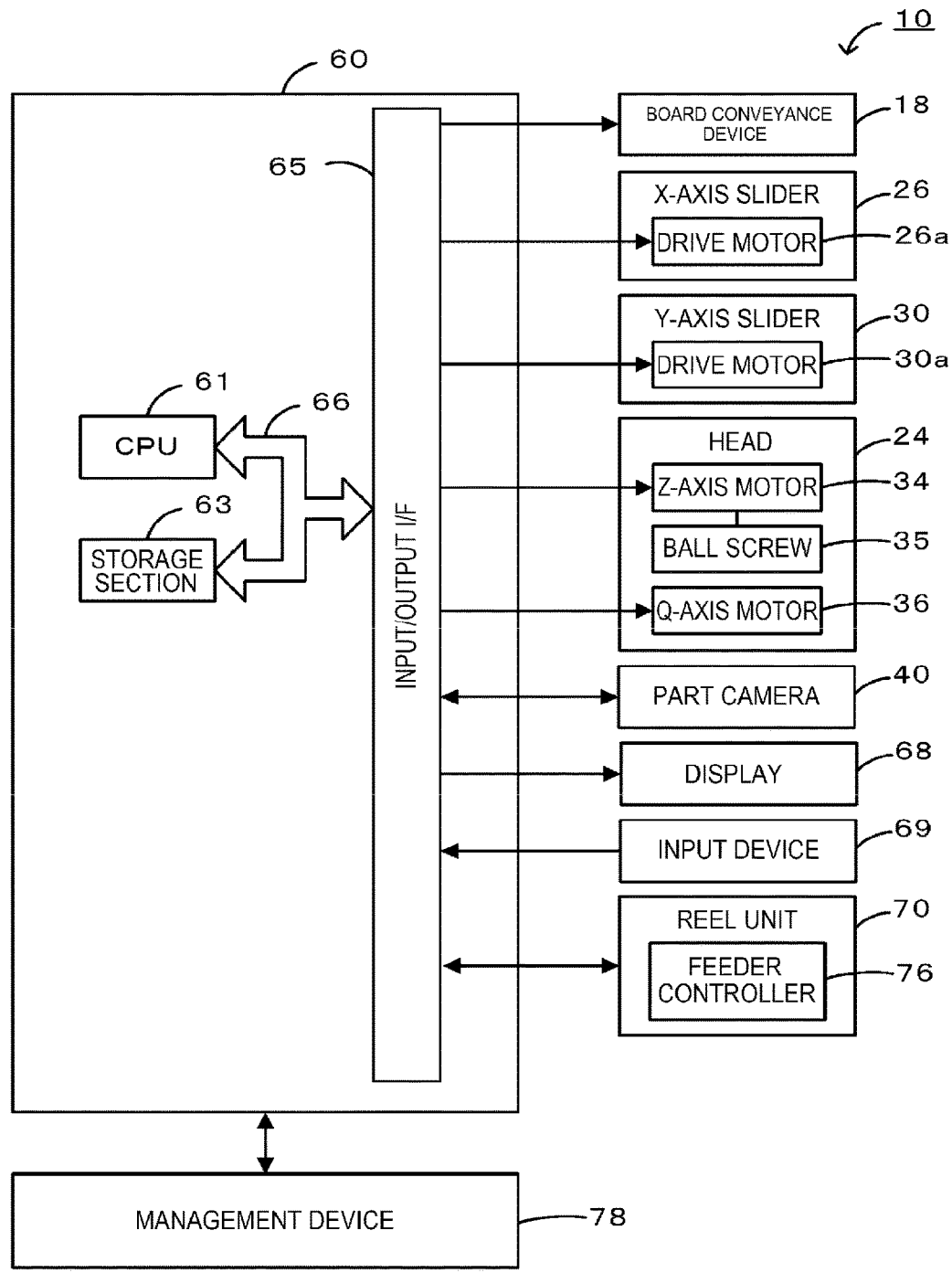
FIG. 2 is a block diagram illustrating a configuration related to control of component mounter 10.

Preferred embodiments of an image processing device disclosed in the present specification will be described below with reference to the accompanying drawings. FIG. 1 is a perspective view of component mounter 10, FIG. 2 is a block diagram illustrating a configuration related to control of component mounter 10, FIG. 3 is a plan view of board 80, and FIG. 4 is an explanatory diagram of information stored in storage section 63. In the present embodiment, a left-right direction (an X axis), a front-rear direction (a Y axis), and an up-down direction (a Z axis) are as illustrated in FIG. 1.

Component mounter 10 includes board conveyance device 18, head 24, nozzle 37, part camera 40, display 68, reel unit 70, and control device 60.

Board conveyance device 18 is a device for conveying and holding board 80. Board conveyance device 18 includes support plates 20 and 20 and conveyor belts 22 and 22 (only one is illustrated in FIG. 1). Support plates 20 and 20 are members extending in the left-right direction and are provided at intervals in front and rear in FIG. 1. Conveyor belts 22 and 22 are bridged to drive wheels and driven wheels provided on the left and right of support plates 20 and 20 in an endless loop. Board 80 is placed on upper surfaces of a pair of conveyor belts 22 and 22 and is conveyed from the left to the right. Board 80 can be supported from a bottom surface side by many erected support pins 23. Accordingly, board conveyance device 18 also serves as a board supporting device.

Head 24 is attached to a front surface of X-axis slider 26. X-axis slider 26 is attached to a front surface of Y-axis slider 30. Y-axis slider 30 is slidably attached to a pair of left and right guide rails 32 and 32 which extend in the front-rear direction. A pair of upper and lower guide rails 28 and 28 which extend in the left-right direction are provided on the front surface of Y-axis slider 30. X-axis slider 26 is slidably attached to these guide rails 28 and 28. Head 24 moves in the left-right direction as X-axis slider 26 moves in the left-right direction, and moves in the front-rear direction as Y-axis slider 30 moves in the front-rear direction. Sliders 26 and 30 are respectively driven by drive motors 26a and 30a (refer to FIG. 2). Further, head 24 embeds Z-axis motor 34 such that a height of nozzle 37 attached to ball screw 35 extending in the Z axis is adjusted by Z-axis motor 34. Furthermore, head 24 embeds Q-axis motor 36 (refer to FIG. 2) for axially rotating nozzle 37.

Nozzle 37 is a member for picking up a component at a nozzle tip and holding the component thereto and releasing the component picked up by the nozzle tip. Nozzle 37 can supply a pressure from a pressure supply source (not illustrated) and pick up a component when, for example, a negative pressure is supplied thereto and releases the component when supply of a negative pressure stops or a positive pressure is supplied thereto. Nozzle 37 protrudes downward from a bottom surface of a main body of head 24. Further, a height of a component picked up by nozzle 37 is adjusted by lifting and lowering nozzle 37 being in the Z-axis direction by using Z-axis motor 34. An orientation of the component picked up by nozzle 37 is adjusted by rotating nozzle 37 by using Q-axis motor 36.

Part camera 40 is disposed in front of board conveyance device 18. An upper part of part camera 40 is an imaging range, and part camera 40 images a component held by nozzle 37 from below to generate a captured image.

Display 68 displays various images in color or in black and white.

Reel unit 70 includes multiple feeders 74 detachably mounted therein. Feeders 74 include reels 71. Tape 72 is wound around reel 71. Multiple accommodation recess portions 73 are provided in a top surface of tape 72 in a longitudinal direction of tape 72. Components are accommodated in accommodation recess portions 73. The components are protected by a film covering the top surface of tape 72. Tape 72 configured as described above is unwound from reel 71 toward the rear, and the film is peeled off in predetermined component supply position 74a of feeder 74, where the component is in an exposed state. The component sent to predetermined component supply position 74a are picked up by nozzle 37. An operation of reel unit 70 is controlled by feeder controller 76 (refer to FIG. 2) included in each feeder 74.

As illustrated in FIG. 2, control device 60 includes CPU 61, storage section 63 (ROM, RAM, HDD, or the like), input/output interface 65, and the like, which are connected to each other via bus 66. Control device 60 outputs drive signals to board conveyance device 18, drive motor 26a of X-axis slider 26, drive motor 30a of Y-axis slider 30, Z-axis motor 34, Q-axis motor 36, part camera 40, display 68, and a pressure supply source (not illustrated) for nozzle 37. Further, control device 60 receives a captured image from part camera 40, and an input signal from input device 69 such as a keyboard or a mouse. Control device 60 is communicably connected to feeder controller 76 of reel unit 70. Although not illustrated, sliders 26 and 30 are respectively equipped with position sensors (not illustrated), and control device 60 controls drive motors 26a and 30a of respective sliders 26 and 30 while receiving positional information from the position sensors. Control device 60 is communicably connected to management device 78 that manages a production program and the like.

As illustrated in FIG. 3, board 80 is an aggregate board (so-called multi-surface board) in which multiple unit boards having a common component configuration are arranged. There are two types of unit boards, first unit board 81 having an L shape and second unit board 82 having an inverted L shape. Many sets of pairs of first unit board 81 and second unit board 82 are arranged on board 80 in a vertical direction and a horizontal direction. First and second unit boards 81 and 82 are weakly coupled to board 80. Accordingly, first and second unit boards 81 and 82 can be easily detached from board 80 by pressing. A board number is assigned to each board without distinguishing first unit board 81 and second unit board 82 from each other. As a specific manner of assigning the board numbers, first unit board 81 located in a lower left corner of board 80 is set to board number 1, and board numbers are obtained by counting up one by one by advancing to the right therefrom, and after reaching a lower right corner, counting up one by one by advancing to the right from a left end of a row on one stage, and repeating this sequentially. The board number of first unit board 81 is an odd number, and the board number of second unit board 82 is an even number.

Components having component numbers 1 to m are mounted on first unit board 81 at respective determined positions. As illustrated in FIG. 4, storage section 63 stores positional information of components of first unit board 81 and positional information of first unit board 81. The positional information of the components of first unit board 81 includes XY coordinates indicating positions of the components having component numbers 1 to m, in coordinates with a predetermined position (for example, a lower left corner) of first unit board 81 as an original point, as well as rotation angles θ of the components. The positional information of first unit board 81 includes XY coordinates indicating a predetermined position (an original point) of respective first unit boards 81 having board numbers 1, 3, 5, . . . , (2p-1) in coordinates with a predetermined position (for example, a lower left corner) of board 80 as the original point. The positions of the components having the component numbers 1 to m to be mounted on first unit board 81 having board number (2k-1) can be obtained by using the positional information of first unit board 81 having board number (2k-1) and the positional information of the components having first unit board 81. Therefore, storage section 63 substantially stores positional information of all components to be mounted on first unit board 81. Incidentally, m and p are integers greater than or equal to 2, and k is an integer of any of 1 to p.

Components having component numbers 1 to n are mounted on second unit board 82 at respective determined positions. As illustrated in FIG. 4, storage section 63 stores positional information of components of second unit board 82 and positional information of second unit board 82. The positional information of the components of second unit board 82 includes XY coordinates indicating positions of components having component numbers 1 to n as well as rotation angles (θ) of the components, in coordinates with a predetermined position (for example, a lower left corner) of second unit board 82 as an original point. The positional information of second unit board 82 includes XY coordinates indicating predetermined positions (original points) of second unit board 82 having board numbers 2, 4, 6, . . . , (2p), in coordinates with a predetermined position (for example, a lower left corner) of board 80 as an original point. The positions of the components having the component numbers 1 to n to be mounted on second unit board 82 having board number (2$i$) can be obtained by using positional information of second unit board 82 having board number (2$i$) and positional information of the components of second unit board 82. Therefore, storage section 63 substantially stores positional information of all components to be mounted on second unit board 82. n is an integer greater than or equal to 2, and i is an integer of any of 1 to p.

Storage section 63 further stores board graphics (L-shaped graphics and inverted L-shaped graphics) used when board 80 or first and second unit boards 81 and 82 are displayed on display 68, as well as component graphics used when components to be mounted on board 80 are displayed on display 68.

Next, an operation when component mounter 10 performs a component mounting process will be described. CPU 61 of control device 60 controls each section of component mounter 10 based on a production program received from management device 78 to product board 80 on which multiple components of multiple types are mounted. Specifically, CPU 61 controls X-axis slider 26 or Y-axis slider 30 such that nozzle 37 faces a component sent to component supply position 74$a$ by feeder 74 which is a component supply device. Subsequently, CPU 61 controls a pressure of nozzle 37 such that a component in component supply position 74$a$ is picked up by nozzle 37. Subsequently, CPU 61 controls part camera 40 so as to capture an image of a component picked up to nozzle 37, and recognizes a posture of the component based on the obtained image of the component. Subsequently, CPU 61 controls X-axis slider 26 and Y-axis slider 30 such that the component is disposed directly above a designated position of board 80 by considering the posture of the component picked up to nozzle 37 and controls a pressure of nozzle 37 such that nozzle 37 releases the component. CPU 61 repeatedly performs the component mounting process, thereby mounting components of a preset number and a preset type on board 80. A mounting line is formed by aligning multiple component mounters 10 configured as described above in the left-right direction. When board 80 is conveyed from uppermost stream component mounter 10 to downmost stream component mounter 10 in one mounting line, all preset components are mounted on board 80.

Figure 5:
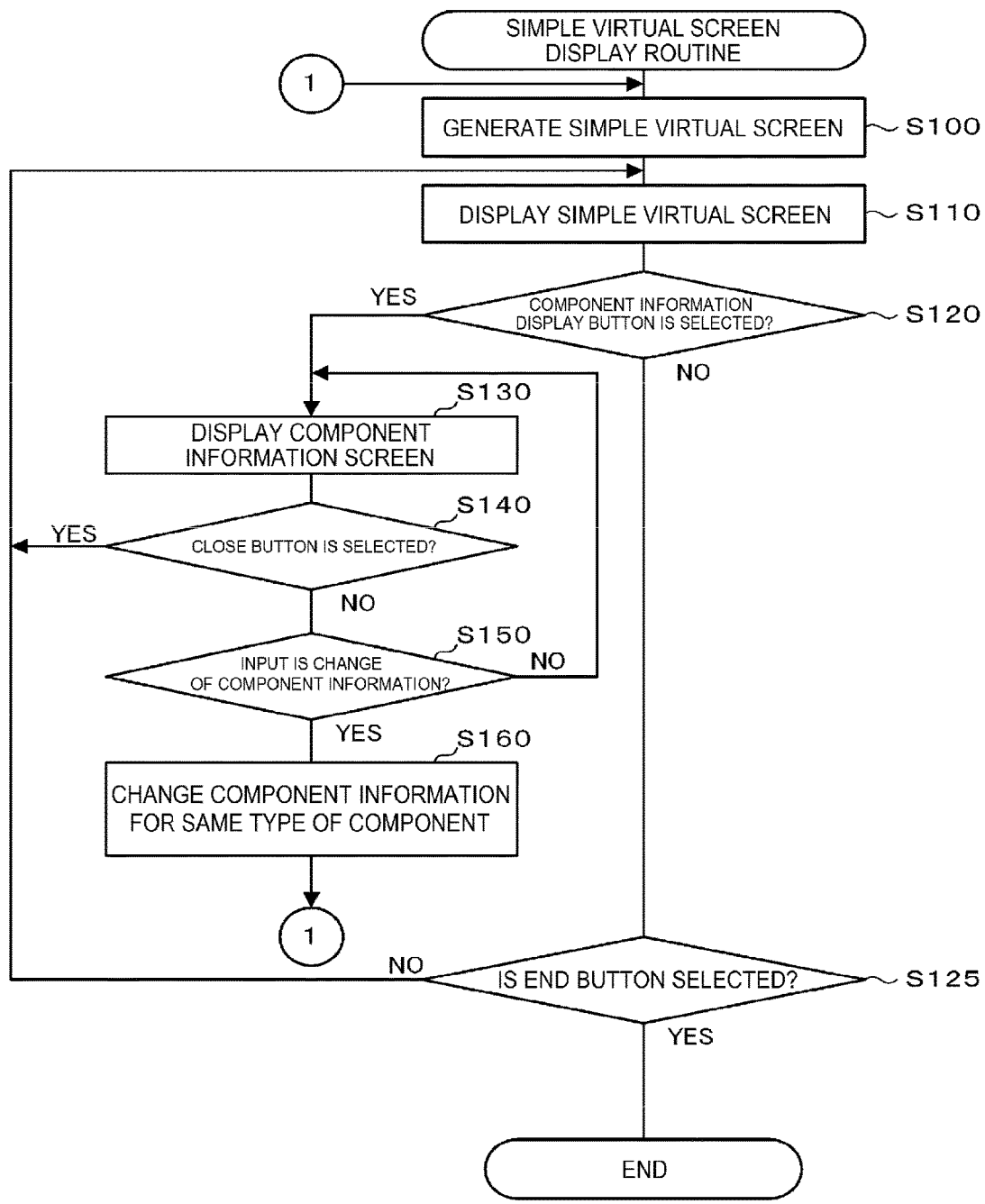
FIG. 5 is a flowchart illustrating an example of a simple virtual screen display routine.

Next, an operation when CPU 61 of control device 60 displays a simple virtual screen of board 80 on display 68 will be described. FIG. 5 is a flowchart illustrating an example of a simple virtual screen display routine.

Figures 6, 7:
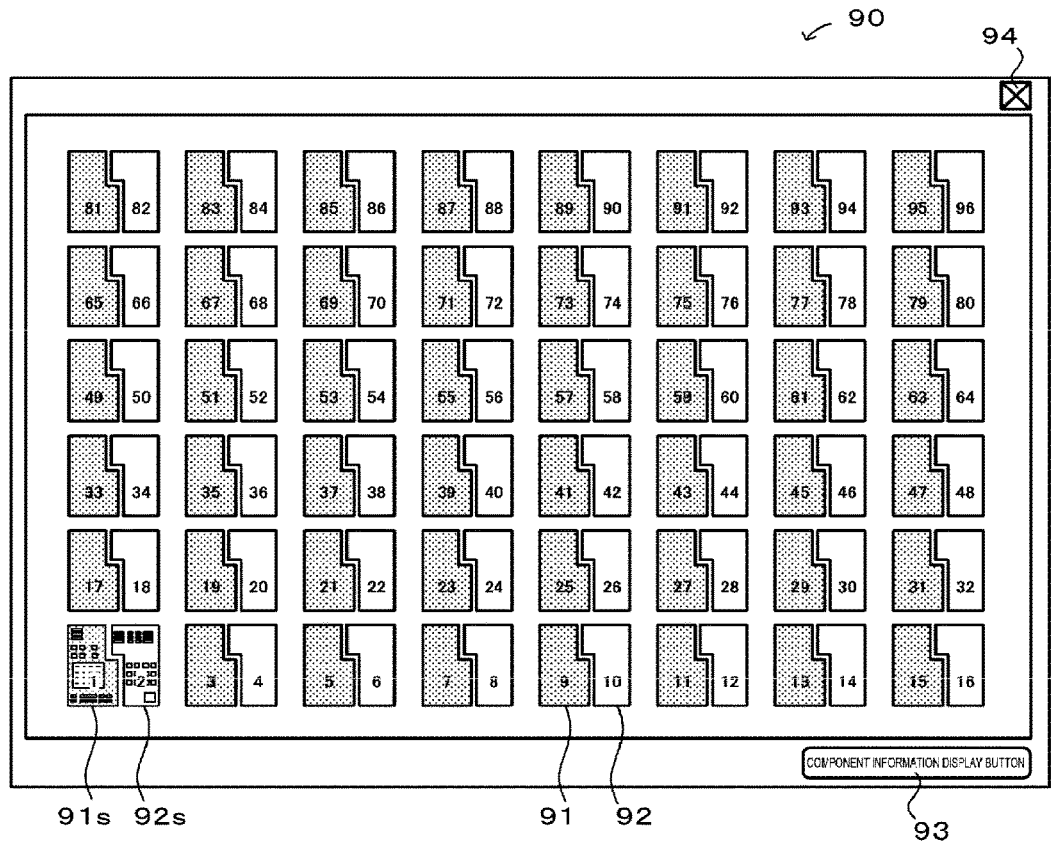
FIG. 6 is an explanatory diagram of simple virtual screen 90.
FIG. 7 is an explanatory diagram of component information screen 95.

When an operator inputs a display request of a simple virtual screen of board 80 from input device 69, CPU 61 starts the simple virtual screen display routine. When starting the routine, CPU 61 first generates simple virtual screen 90 (S100). An example of simple virtual screen 90 is illustrated in FIG. 6. Specifically, in generating simple virtual screen 90, CPU 61 sets first unit board 81 having board number 1 at a lowest left end position among multiple first unit boards 81 as first reference unit board 91$s$, and sets second unit board 82 having board number 2 at a second position from the lowest left end among multiple second unit boards 82 as second reference unit board 92$s$. Subsequently, for first reference unit board 91$s$, CPU 61 generates a detailed image in which respective components are arranged on first reference unit board 91$s$ based on positional information of all components to be mounted on first unit board 81 and positional information of first unit board 81 having board number 1. The detailed image includes an outer frame indicating an outer shape of first unit board 81, a unique color of first unit board 81 painted in the outer frame, and board numbers assigned to respective unit boards. Further, for second reference unit board 92$s$, CPU 61 generates a detailed image in which respective components are arranged on second reference unit board 92$s$ based on positional information of all components to be mounted on second unit board 82 and positional information of second unit board 82 having board number 2. The detailed image includes an outer frame indicating an outer shape of second unit board 81, a unique color of second unit board 82 painted in the outer frame, and board numbers assigned to respective unit boards. Subsequently, CPU 61 generates a simplified image in which first unit board 81 is simplified for first non-reference unit board 91 other than first reference unit board 91$s$. The simplified image includes an outer frame indicating an outer shape of first unit board 81, a unique color of first unit board 81 painted in the outer frame, and board numbers assigned to respective unit boards. Further, CPU 61 generates a simplified image in which second unit board 82 is simplified for second non-reference unit board 92 other than second reference unit board 92$s$. The simplified image includes an outer frame indicating an outer shape of second unit board 82, a unique color of second unit board 81 painted in the outer frame, and board numbers assigned to respective unit boards. Subsequently, CPU 61 generates simple virtual screen 90 by attaching respective detailed images to a position of first reference unit board 91$s$ and a position of second reference unit board 92$s$, and attaching the simplified images to a position of first non-reference unit board 91 and a position of second non-reference unit board 92.

Subsequently, CPU 61 displays simple virtual screen 90 on display 68 (S110). First reference unit board 91$s$ is displayed in simple virtual screen 90 as an image including an L-shaped outer frame, a unique color (displayed by hatching in FIG. 6), board number "1", and multiple components. First non-reference unit board 91 is displayed as an image including an L-shaped outer frame, a unique color (displayed by hatching in FIG. 6), and a board number (odd number). Second reference unit board 92$s$ is displayed as an image including an inverted L-shaped outer frame, a unique color (displayed in white in FIG. 6), board number "2", and multiple components. Second non-reference unit board 92 is displayed as an image including an inverted L-shaped outer frame, a unique color (displayed in white in FIG. 6), and a board number (even number). Component information display button 93 and end button 94 are also displayed on simple virtual screen 90.

Subsequently, CPU 61 determines whether component information display button 93 is selected by an operator (S120). When the component information display button is not selected in step S120, CPU 61 determines whether end button 94 is selected by the operator (S125). When the end button is not selected in step S125, CPU 61 returns to step S110 again. Meanwhile, when component information display button 93 is selected in step S120, CPU 61 displays component information screen 95 on display 68 (S130). An example of component information screen 95 is illustrated in FIG. 7. Component information screen 95 is a screen representing positional information of components of first and second reference unit boards 91$s$ and 92$s$, and positional information of first and second reference unit boards 91$s$ and 92$s$ in a tabular format. Component information screen 95 is generated based on the information in FIG. 4 stored in storage section 63. Close button 96 is also displayed on component information screen 95. Component information screen 95 described above may be displayed to overlap simple virtual screen 90, may be displayed side by side with simple virtual screen 90, or may be displayed as a separate screen by switching a screen with simple virtual screen 90.

Subsequently, CPU 61 determines whether close button 96 is selected by an operator (S140), and closes component information screen 95 when close button 96 is selected, and returns to step S110. Meanwhile, when close button 96 is not selected in step S140, CPU 61 determines whether positional information of at least one component of first and second reference unit boards 91s and 92s is changed by the operator on component information screen 95 (S150) and returns to step S130 again when not changed. Meanwhile, when positional information of a component of first reference unit board 91s is changed in step S150, CPU 61 changes positional information of components for all first boards 81 stored in storage section 63 (S160) and returns to step S100 again. Further, when positional information of a component of second reference unit board 92s is changed in step S150, CPU 61 changes positional information of components for all second boards 82 stored in storage section 63 (S160) and returns to step S100 again. When the positional information of the component is changed, CPU 61 regenerates simple virtual screen 90 based on the positional information of the component after the change in step S100. Meanwhile, when end button 94 is selected by the operator on simple virtual screen 90 in step S125, CPU 61 ends the simple virtual screen display routine.

When displaying a virtual screen of board 80 (an aggregate board in which multiple first and second unit boards 81 and 82 are arranged) viewed from above on display 68, control device 60 of component mounter 10 described in detail above displays a detailed image at positions of first and second reference unit boards 91s and 92s and displays simple virtual screen 90 in which a simplified image is displayed at positions of other first and second non-reference unit boards 91 and 92. Accordingly, the time required for display is reduced, compared to displaying, on display 68, a detailed virtual screen in which detailed images are displayed for all first and second unit boards.

Further, since board numbers (identification codes) are assigned to the detailed image (first and second reference unit boards 91s and 92s) and the simplified image (first and second non-reference unit boards 91 and 92) of simple virtual screen 90, an operator can identify respective unit boards based on the board numbers.

Furthermore, since colors are assigned to the detailed image and the simplified image, the operator can recognize whether it is first unit board 81 or second unit board 82 based on the colors.

Furthermore, since first unit board 81 and second unit board 82 are included in board 80, detailed images (first reference unit board 91s and second reference unit board 92s) are displayed for each type. Accordingly, the operator can check arrangement or the like of components based on the detailed images for each type.

Then, since positional information of components of first and second reference unit boards 91s and 92s and positional information of the boards are displayed on component information screen 95, the time required for display is reduced compared to a case where the positional information of the components is displayed for all unit boards.

Then, Further, when the positional information of a component for first reference unit board 91s is changed by the operator, CPU 61 changes the positional information of the components stored in storage section 63 for all first unit boards 81. Accordingly, an operation of changing positional information of components of respective first unit boards 81 can be performed in a short time. This also applies to second unit board 82.

The present disclosure is not limited in any way to the above embodiment, and it is needless to say that the present disclosure can be carried out in various aspects without departing from the technical scope of the present disclosure.

Figure 8:
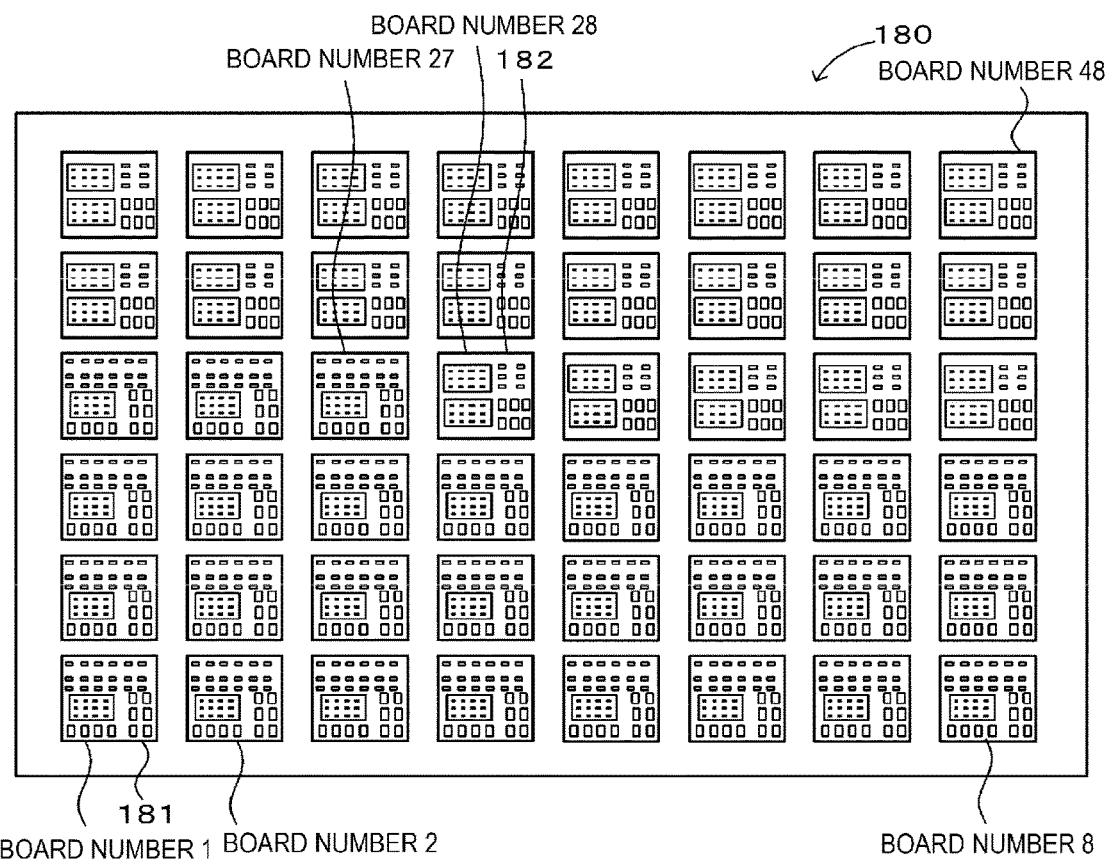
FIG. 8 is a plan view of board 180.
Figure 9:
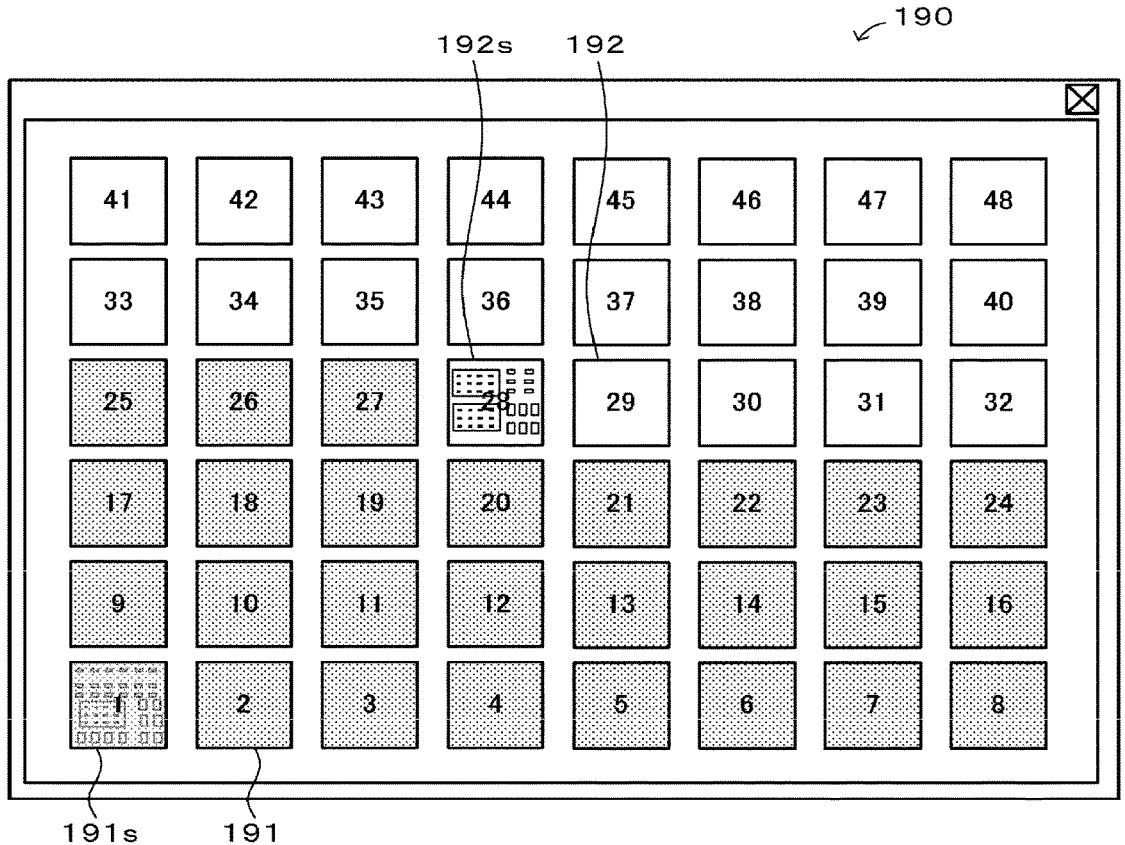
FIG. 9 is an explanatory diagram of simple virtual screen 190.

For example, in the above embodiment, board 80 in which many pairs of first unit board 81 and second unit board 82 are arranged in a vertical direction and a horizontal direction is exemplified, however, as in board 180 illustrated in FIG. 8, a region in which many first unit boards 181 are arranged may be separated from a region in which multiple second unit boards 182 are arranged. Board 180 includes first unit board 81 having board numbers 1 to 27, and second unit board 82 having board numbers 28 to 48. A manner of assigning the board numbers is the same as in the above embodiment. Simple virtual screen 190 corresponding to board 180 is illustrated in FIG. 9. In simple virtual screen 190, board number 1 is first reference unit board 191s (detailed image), board numbers 2 to 27 are first non-reference unit boards 191 (simplified image), board number 28 is second reference unit board 192s (detailed image), and board numbers 29 to 48 are second non-reference unit boards 192 (simplified image). Even with board 180, the same advantages as in the present embodiment can be obtained.

Figure 10:
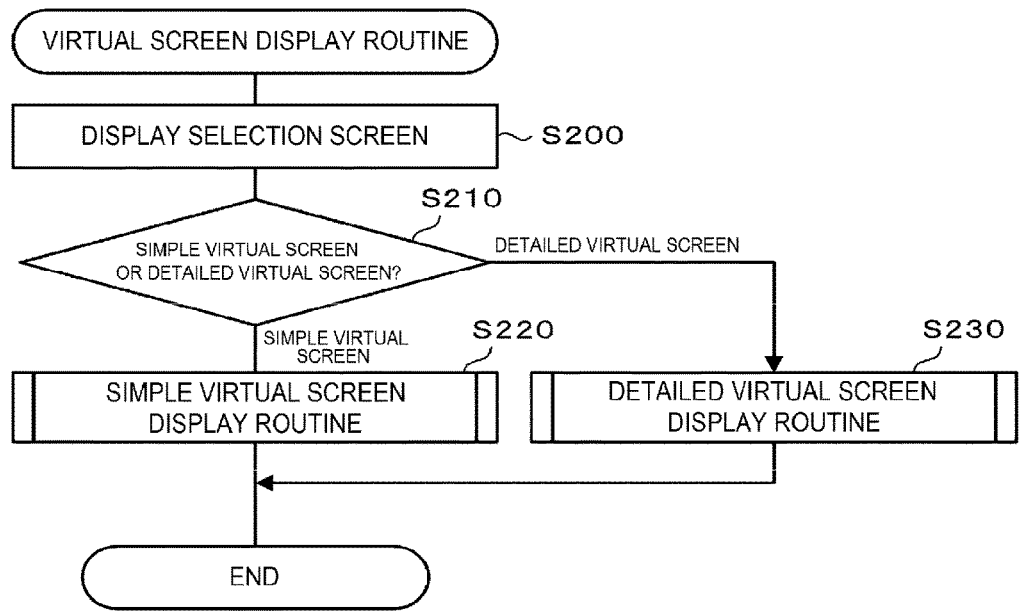
FIG. 10 is a flowchart illustrating an example of a virtual screen display routine.

In the embodiment described above, CPU 61 performs a simple virtual screen display routine but may perform the virtual screen display routine illustrated in FIG. 10. When starting the virtual screen display routine, CPU 61 first displays a selection screen on display 68 (S200). The selection screen includes a simple virtual screen selection button and a detailed virtual screen selection button. Subsequently, CPU 61 determines which button is selected by the operator (S210). When the simple virtual screen selection button is selected in step S210, CPU 61 performs the simple virtual screen display routine illustrated in FIG. 5, and then ends the virtual screen display routine. Meanwhile, when the detailed virtual screen selection button is selected in step S210, CPU 61 performs a detailed virtual screen display routine. The detailed virtual screen display routine is the same as the simple virtual screen display routine of FIG. 5 except that a detailed virtual screen is generated instead of simple virtual screen 90 in step S100, and a detailed virtual screen is displayed on display 68 instead of simple virtual screen 90 in step S110. The detailed virtual screen is a screen in which a detailed image (first reference unit board 91s) is disposed at positions of all first unit boards 81, and a detailed image (second reference unit board 92s) is disposed at positions of all second unit boards 82. Accordingly, the time required to generate the detailed virtual screen is longer than the time required to generate simple virtual screen 90. According to the virtual screen display routine of FIG. 10, since whether to display a simple virtual screen or a detailed virtual screen on display 68 is switched depending on a request of an operator, convenience of the operator is increased.

In the above embodiment, control device 60 of component mounter 10 is exemplified as an image processing device of the present disclosure; however, the configuration is not limited to this in particular, and, for example, management device 78 may be used as the image processing device of the present disclosure. In this case, when management device 78 changes a production program or the like, the operator can display simple virtual screen 90 on the display connected to management device 78.

In the above embodiment, component information screen 95 is displayed when component information display button 93 is selected by an operator, but component information screen 95 may also be constantly displayed when simple virtual screen 90 is displayed.

In the above embodiment, positional information of components of first and second reference unit boards 91$s$ and 92$s$ and positional information of first and second reference unit boards 91$s$ and 92$s$ are displayed on component information screen 95, but positional information of all first and second unit boards 81 and 82 may be displayed.

In the above embodiment, positional information of components of first and second unit boards 81 and 82 and positional information of first and second unit boards 81 and 82 are stored in storage section 63 in the format illustrated in FIG. 4 but may be stored in another format. For example, positions of all components to be mounted on board 80 may be displayed with coordinates having a predetermined position (for example, a lower left corner) of board 80 as an original point. In this case, only positional information of a component of first reference unit board 91$s$ may be displayed on component information screen 95. Further, when positional information of a certain component for first reference unit board 91$s$ is changed by an operator, it is preferable that positional information of components for all first unit boards 81 among the information stored in storage section 63 is also changed. The same applies to second unit board 82.

In the above embodiment, although board numbers and unique colors are assigned to detailed images of first and second reference unit boards 91$s$ and 92$s$, the board numbers of the detailed image may be omitted, or the unique colors of the detailed image may be omitted.

The image processing device disclosed in the present specification may be configured as follows.

In the image processing device disclosed in the present specification, the simplified image may be an image including an outer frame set based on an outer shape of a unit board. By doing so, a simplified image can be generated in a short time. In this case, the simplified image may include at least one of an identification code set for each unit board and a color set for each type of the unit boards, in addition to the outer frame. When an identification code is assigned to the simplified image, an operator can identify a unit board based on the identification code. When a color is assigned to the simplified image, the operator can recognize which type of unit board is identified based on the color. An identification code or a color may also be assigned to a detailed image.

In the image processing device disclosed in the present specification, the aggregate board may include two or more types of the unit boards. By doing so, when two or more types of the unit boards are included in the aggregate board, a reference unit board is displayed as a detailed image for each type.

In the image processing device disclosed in the present specification, a control section can display positional information of all components to be mounted on the reference unit board on the display together with or separately from the virtual screen, for the reference unit board, and the positional information of the components may not be displayed on the display for the non-reference unit board. By doing so, positional information of a component is displayed only for a reference unit board, and thus, the time required for display is reduced compared to a case where positional information of the component is displayed for all unit boards. A positional information of a component may be displayed on a display together with or separately from a virtual screen when requested by an operator.

In the image processing device disclosed in the present specification, the control section may switch whether to display the simple virtual screen as the virtual screen or to display a detailed virtual screen for displaying the detailed image for all the reference unit board and the non-reference unit board, in response to a request from an operator. By doing so, convenience of the operator is increased.

In the image processing device disclosed in the present specification, when an operator changes positional information of the components for the reference unit board, the control section may change positional information of the components stored in the storage section not only for the reference unit board but also for the non-reference unit board. By doing so, an operation of changing positional information of components of respective unit boards can be performed in a short time.

INDUSTRIAL APPLICABILITY

The present disclosure can be used when a virtual screen obtained by viewing, from above, an aggregate board in which multiple unit boards are arranged is displayed on a display.

REFERENCE SIGNS LIST

10 component mounter, 18 board conveyance device, 20 support plate, 22 conveyor belt, 23 support pin, 24 head, 26 X-axis slider, 26*a* drive motor, 28 guide rail, 30 Y-axis slider, 30*a* drive motor, 32 guide rail, 34 Z-axis motor, 35 ball screw, 36 Q-axis motor, 37 nozzle, 40 part camera, 60 control device, 61 CPU, 63 storage section, 65 input/output interface, 66 bus, 68 display, 69 input device, 70 reel unit, 71 reel, 72 tape, 73 accommodation recess portion, 74 feeder, 74*a* component supply position, 76 feeder controller, 78 management device, 80 board, 81 first unit board, 82 second unit board, 90 simple virtual screen, 91$s$ first reference unit board, 91 first non-reference unit board, 92$s$ second reference unit board, 92 second non-reference unit board, 93 component information display button, 94 end button, 95 component information screen, 96 close button, 180 board, 181 first unit board, 182 second unit board, 190 simple virtual screen, 191$s$ first reference unit board, 191 first non-reference unit board, 192$s$ second reference unit board, 192 second non-reference unit board

The invention claimed is:

1. An image processing device for displaying, on a display, a virtual screen obtained by viewing, from above, an aggregate board in which multiple unit boards having a common component configuration are arranged, the image processing device comprising:
    a storage section configured to store positional information of all components to be mounted on the unit boards, and
    a control section configured to
        designate one unit board at a predetermined position among the multiple unit boards as a reference unit board,
        generate a detailed image in which respective components are arranged on the reference unit board based on the positional information of all components to be mounted on the unit boards, designate the unit boards other than the reference unit board as non-reference unit boards, generate a simplified image obtained by simplifying the reference unit board, for the non-reference unit boards, and display a simple virtual screen displaying the detailed image at a position of the reference unit board and the simplified image at positions of the non-reference unit boards.

2. The image processing device of claim 1, wherein the simplified image is an image including an outer frame set based on an outer shape of the reference unit board.

3. The image processing device of claim 2, wherein the simplified image includes at least one of an identification code set for each of the unit boards and a color set for each type of the unit boards in addition to the outer frame.

4. The image processing device according to claim 1, wherein the aggregate board includes two or more types of the unit boards.

5. The image processing device according to claim 1, wherein the control section is configured to display, on the display, positional information of all components to be mounted on the reference unit board together with or separately from the virtual screen for the reference unit board, and does not display the positional information of the components on the display for the non-reference unit boards.

6. The image processing device according to claim 1, wherein the control section switches whether to display the simple virtual screen or to display a detailed virtual screen displaying the detailed image for all of the reference unit board and the non-reference unit boards in response to a request from an operator.

7. The image processing device according to claim 1, wherein, when an operator changes the positional information of the components for the reference unit board, the control section changes the positional information of the components stored in the storage section not only for the reference unit board but also for the non-reference unit boards.

\* \* \* \* \*